(12) United States Patent
Chien et al.

(10) Patent No.: US 10,041,994 B2
(45) Date of Patent: Aug. 7, 2018

(54) METHOD AND SYSTEM FOR PREDICTING HIGH-TEMPERATURE OPERATING LIFE OF SRAM DEVICES

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Wei-Ting Chien, Shanghai (CN); Yueqin Zhu, Shanghai (CN); Yongliang Song, Shanghai (CN); Yong Zhao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 92 days.

(21) Appl. No.: 15/348,669

(22) Filed: Nov. 10, 2016

(65) Prior Publication Data
US 2017/0285099 A1    Oct. 5, 2017

(30) Foreign Application Priority Data
Mar. 31, 2016  (CN) .......................... 2016 1 0196265

(51) Int. Cl.
*G01R 31/28*     (2006.01)
*G01R 31/26*     (2014.01)

(52) U.S. Cl.
CPC ..... *G01R 31/2875* (2013.01); *G01R 31/2642* (2013.01)

(58) Field of Classification Search
None
See application file for complete search history.

(56) References Cited

U.S. PATENT DOCUMENTS

| | | | |
|---|---|---|---|
| 6,414,508 B1* | 7/2002 | London | G01R 31/3161 |
| | | | 324/762.05 |
| 2004/0085084 A1* | 5/2004 | Wang | G11C 29/006 |
| | | | 324/762.03 |

(Continued)

OTHER PUBLICATIONS

European Patent Application No. 17162508.0, Extended European Search Report dated Jul. 31, 2017, 10 pages.

*Primary Examiner* — Jermele M Hollington
*Assistant Examiner* — Douglas X Rodriguez
(74) *Attorney, Agent, or Firm* — Kilpatrick Townsend & Stockton LLP

(57) ABSTRACT

A method for predicting high-temperature operating life of an integrated circuit (IC) includes performing bias temperature instability tests and high-temperature operating life tests on a device of the IC, establishing a relationship between the device bias temperature instability and the IC's high-temperature operating life based on a result of the bias temperature instability tests and the high-temperature operating life tests. The method further includes providing a lot of subsequent integrated circuits (ICs), performing wafer-level bias temperature instability tests on a device of the ICs, and predicting high-temperature operating life of the ICs based on a result of the wafer-level bias temperature instability tests and based on the established relationship between the device's bias temperature instability and the IC's high-temperature operating life. The method can save significant (Continued)

effort and time over conventional approaches for accurate prediction of high-temperature operating life of an IC.

16 Claims, 11 Drawing Sheets

(56) References Cited

U.S. PATENT DOCUMENTS

| | | |
|---|---|---|
| 2005/0278677 A1 | 12/2005 | Ang et al. |
| 2006/0158210 A1 | 7/2006 | Tsai et al. |
| 2008/0174329 A1* | 7/2008 | Papageorgiou .... G01R 31/2884 324/762.01 |
| 2011/0010117 A1 | 1/2011 | Chen et al. |
| 2011/0037494 A1* | 2/2011 | Hung ................. G01R 31/3004 324/762.03 |
| 2011/0173432 A1 | 7/2011 | Cher et al. |
| 2014/0177323 A1 | 6/2014 | Hegde et al. |
| 2014/0244212 A1 | 8/2014 | Allen-Ware et al. |

* cited by examiner

NMOS

METHOD AND SYSTEM FOR PREDICTING HIGH-TEMPERATURE OPERATING LIFE OF SRAM DEVICES

CROSS-REFERENCES TO RELATED APPLICATIONS

This application claims priority to Chinese patent application No. 201610196265.2, filed on Mar. 31, 2016, the content of which is incorporated herein by reference in its entirety.

FIELD OF THE INVENTION

The present disclosure generally relates to the field of integrated circuit technology, and more particularly, to a method and apparatus for predicting high-temperature operating life of an integrated circuit device.

BACKGROUND OF THE INVENTION

In high-k metal gate (HKMG) technology, bias temperature instability (BTI) of a device in an integrated circuit (IC) device is one of the most challenging issues in circuit reliability. BTI may cause degradation of various circuit parameters, such as the linearity, saturation leakage current, threshold voltage, and others. A threshold voltage shift may degrade the reliability of the IC device.

In various reliability tests, high-temperature operating life (HTOL) testing of an IC device is used to assess the durability of the IC device for a period of time under over-heating and over-voltage conditions. Conventional HTOL tests are carried out in the package level, and the HTOL tests generally extend over a long period of time. This results in a serious time bottleneck for improving HTOL performance of an IC device. Thus, there is a need for an early HTOL prediction to speed up the reliability improvement process.

BRIEF SUMMARY OF THE INVENTION

Embodiments of the present disclosure provide a method and an apparatus for predicting high-temperature operating life (HTOL) of an IC that can solve the above-described problems. In some embodiments, a method for predicting a high-temperature operating life of an integrated circuit includes providing an integrated circuit (IC) having a plurality of first devices, performing bias temperature instability tests on a first device of the plurality of first devices, performing high-temperature operating life tests on the IC, establishing a relationship (correlation) between the first device's bias temperature instability and the IC's high-temperature operating life based on a result of the bias temperature instability tests and the high-temperature operating life tests, providing a lot of subsequent integrated circuits (ICs) each having a plurality of second devices, performing wafer-level bias temperature instability tests on a second devices of the plurality of second devices, and predicting high-temperature operating life of the lot of subsequent integrated circuits based on a result of the wafer-level bias temperature instability tests of the second device and based on the established relationship between the first device's bias temperature instability and the IC's high-temperature operating life.

In one embodiment, the high-temperature operating life tests include testing a change of a minimum operating voltage of the IC over time.

In one embodiment, the IC is a static random access memory (SRAM) device, and the high-temperature operating life tests comprise testing a minimum read operating voltage of the SRAM device. The first device is a pull-down MOS transistor of the SRAM device.

In one embodiment, performing the bias temperature instability tests includes positive bias temperature instability tests of the pull-down MOS transistor. In one embodiment, performing the bias temperature instability tests includes testing a change of a threshold voltage of the pull-down MOS transistor over time.

In one embodiment, the relationship between the first device's bias temperature instability and the IC's high-temperature operating life represents a relationship between a threshold voltage degradation of a single device of a memory device and a minimum read operating voltage degradation of the memory device. In some embodiments, the single device is a MOS transistor, and the memory device includes multiple memory cell units. Each cell unit includes a multitude of MOS transistors, i.e., devices.

In one embodiment, the bias temperature instability tests and the high-temperature operating life tests are performed under a same stress condition.

Embodiments of the present invention also provide an apparatus for predicting a high-temperature operating life of an integrated circuit including multiple first devices (transistors). The apparatus includes a first test unit configured to perform bias temperature instability tests on a first device of the multiple first devices and high-temperature operating life tests of the integrated circuit (IC), an analyzing unit configured to establish a relationship between the first device's bias temperature instability and the IC's high-temperature operating life based on a result of the bias temperature instability tests and the high-temperature operating life tests, a second test unit configured to perform wafer-level bias temperature instability tests on a second device of a lot of subsequent integrated circuits each having multiple second devices (transistors), and a prediction unit configured to predict high-temperature operating life of the lot of subsequent integrated circuits based on a result of the second device's wafer-level bias temperature instability tests and on the established relationship between the first device's bias temperature instability and the IC's high-temperature operating life.

In one embodiment, the high-temperature operating life tests include measuring a change of a minimum operating voltage of the IC over time.

In one embodiment, the IC is a static random access memory (SRAM) device, and the high-temperature operating life tests comprise testing a minimum read operating voltage of the SRAM device. In one embodiment, the first device is a pull-down MOS transistor of the SRAM device.

In one embodiment, the first test unit is configured to perform positive bias temperature instability tests of the pull-down MOS transistor. In one embodiment, the first test unit is configured to monitor (measure) a change of a threshold voltage of the pull-down MOS transistor over time.

In one embodiment, the established relationship between the first device's bias temperature instability and the IC's high-temperature operating life represents a relationship between a threshold voltage degradation of a single device (transistor) of a memory device and a minimum read operating voltage degradation of the memory device.

In one embodiment, the first test unit performs the bias temperature instability tests of the first device and the high-temperature operating life tests of the integrated circuit under a same stress condition.

The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Figure 1:
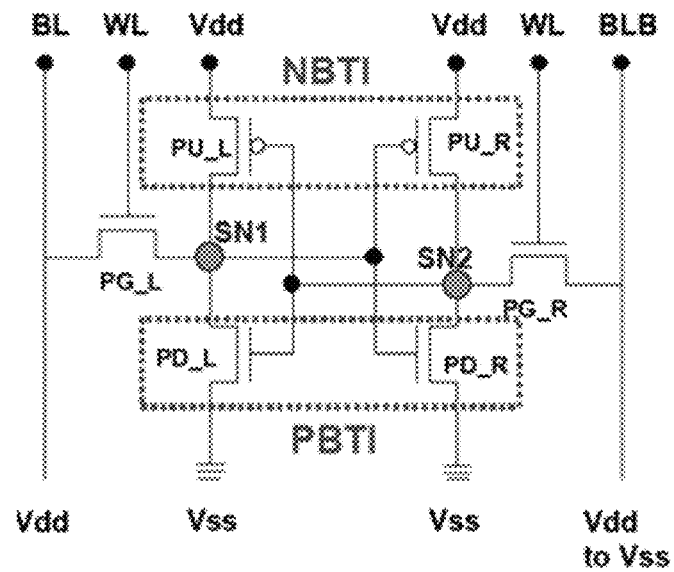
FIG. 1 is a circuit diagram illustrating a static random access memory (SRAM) SRAM bit cell.

The present invention relates to a method and apparatus for predicting the high-temperature operating life of an IC. The following description is presented to enable one of skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

It will be further understood that the terms comprising", "including", having" and variants thereof, when used in this specification, specify the presence of stated features, steps, operations, elements, and/or components, but do not preclude the presence or addition of one or more other features, steps, operations, elements, components, and/or groups thereof. in contrast, the term "consisting of" when used in this specification, specifies the stated features, steps, operations, elements, and/or components, and precludes additional features, steps, operations, elements and/or components.

As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

The present invention will be understood more fully from the detailed description given below and from the accompanying drawings of the preferred embodiments of the invention, which, however, should not be taken to limit the invention to the specific embodiments, but are for explanation and understanding only.

In high-k metal gate technology, the positive bias temperature instability (PBTI) degradation of an NMOS transistor is an important factor that needs to be assessed. Compared with conventional polysilicon gate—silicon oxide technology, the PBTI effect on a high-k metal gate NMOS transistor is more serious. Bias temperature instability (BTI) degradation may adversely affect parameters of an IC device, such as the linearity, leakage current, threshold voltage, and others. A shift in the threshold voltage may degrade the device performance. A threshold voltage shift degrades the device reliability and is thus a key HTOL factor that increases the product level failure rate. The threshold voltage shift caused by bias temperature instability (BTI) on high-temperature operating life (HTOL) of an SRAM device will be described in detail below.

FIG. 1 is a circuit diagram illustrating a basic static random access memory (SRAM) SRAM bit cell 100. As shown in FIG. 1, SRAM bit cell 100 includes a pair of cross-coupled inverters formed of a first pull-up transistor PU_L, a first pull-down transistor PD_L, a second pull-up transistor PU_R, and a second pull-down transistor PD_R. SRAM cell 10 also includes a first transfer transistor PG_L operatively connecting a first storage node SN1 to a bit line BL, and a second transfer transistor PG_R operatively connecting a second storage node SN2 to a bit line BLB. First and second transfer transistors PG_L and PG_R are controlled by a word line WL.

SRAM cell 100 includes six transistors. Pull-up transistors PU_L and PU_R are PMOS transistors and have a negative bias temperature instability (NBTI) in a high-k gate dielectric process. Pull-down transistors PD_L and PD_R are NMOS transistors and have a positive bias temperature instability (PBTI) in a high-k gate dielectric process. NBTI stress is applied to the PMOS transistors. PBTI stress is applied to the NMOS transistors. PBTI in NMOS transistors is not critical in silicon dioxide dielectrics. However, PBTI significantly contributes to the HTOL of the device.

Figure 2:
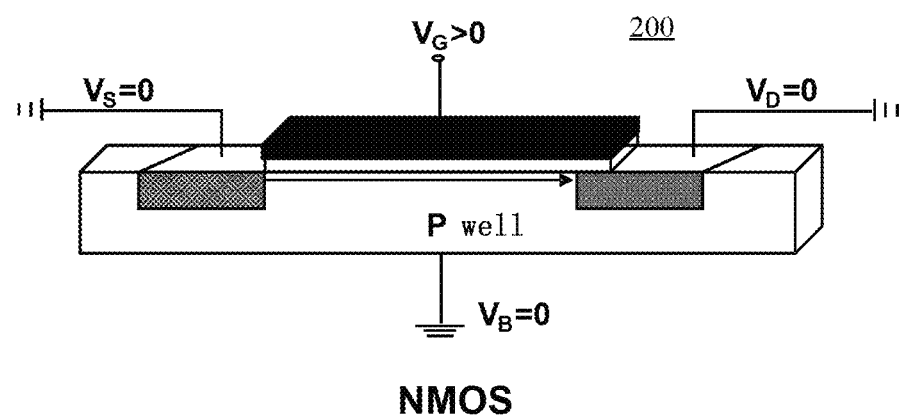
FIG. 2 is a schematic view of the structure of an NMOS device of an SRAM bit cell.

FIG. 2 is a schematic view of the structure of an NMOS device 200 of an SRAM bit cell. As shown in FIG. 2, NMOS device 200 includes a P-well, N-type source and drain region positioned at opposite ends of the P-well, and an N-type gate on the P-well. The source region is connected to Vs, the drain region is connected to Vd, the P-well is connected to Vb. The gate is connected to a positive voltage. NMOS PBTI plays a more critical role due to the pre-existing high trap density in the HfO2 film. Such a high trap density will result in more severe electron trapping and more significant shifts of device parameters.

In high-k process technology, the minimum operating voltage of the SRAM cell is the key parameter of its high-temperature operating life (HTOL), the read Vccmin degradation is dominant in SRAM Vccmin degradation, and PD NMOS PBTI degradation dominates the read Vccmin degradation, which is especially significant for the HKMG process. Such situation is even worse at the HKMG development phase because of an initially un-optimized HK dielectric process. PBTI of the NMOS transistor is the main parameter that affects the minimum read operating voltage of the SRAM bit cell. Through testing, it has been determined that the degradation of the minimum read operating voltage of the SRAM bit cell and the degradation of the threshold voltage of the NMOS PBTI have a similar slope over time. Thus, an initial assessment and prediction of the HTOL performance can be carried out at an early stage based on the relationship (correlation) between BTI and HTOL.

Based on the above description, the present invention provides a method for predicting high-temperature operating life (HTOL) of an integrated circuit (alternatively referred to as IC or chip) based on the relationship between BTI and HTOL under the same stress conditions, and using fast wafer-level reliability (WLR) BTI tests under high stress conditions to predict the IC's HTOL in a relatively short time period. Various embodiments of the present invention will be described in detail below.

Figure 3:
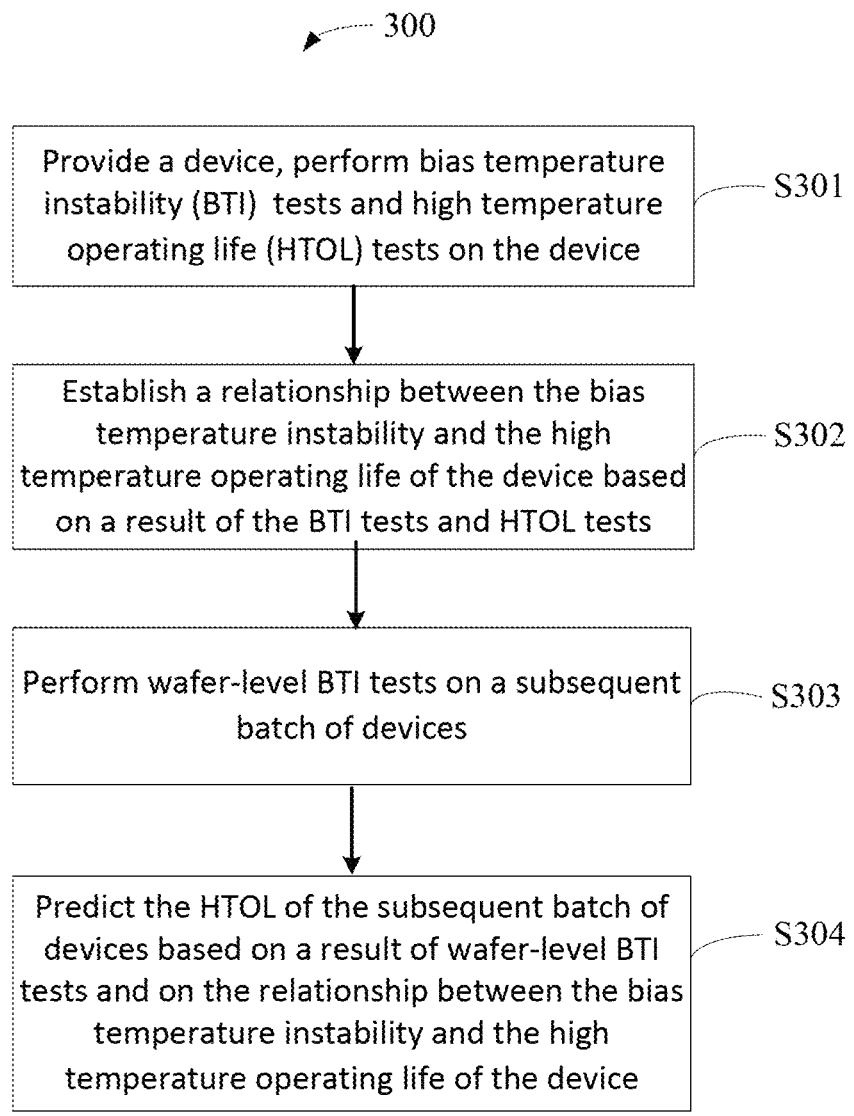
FIG. 3 is a flowchart illustrating a method for predicting high-temperature operating life of an IC according to an embodiment of the present invention.

FIG. 3 is a flowchart illustrating a method 300 for predicting the high-temperature operating life (HTOL) of an IC (chip, device) according to an embodiment of the present invention. Method 300 includes:

Step S301: providing an integrated circuit (e.g., IC, chip) having multiple first devices (transistors); performing bias temperature instability (BTI) tests on a first device of the multiple first devices that affect high-temperature operating life (HTOL) of the IC (chip), and perform HTOL tests on the IC. As used herein, an IC or chip is formed on a wafer used for performing HTOL tests. The terms "first devices" and "second devices" are used herein to differentiate between different devices in different wafers. The first and second devices may have the same structure.

In step S301, the BTI tests and the HTOL tests are performed under the same test conditions. In an exemplary embodiment, an SRAM device is the object to be assessed. As described above, PBTI of the pull-down NMOS transistor in a basic SRAM bit cell is the main factor that affects HTOL of the IC. Thus, in step S301, the PBTI tests on a first device (e.g., a pull-down NMOS transistor) and HTOL tests on the IC (memory bit cell) are performed.

An NMOS transistor of the basic SRAM bit cell serves as the test structure. PBTI tests are conducted under the following conditions: at a temperature of 125° C., the voltage applied to the gate is $V_G=1.4*Vcc$ or $1.6*Vcc$ (Note that, as used herein, Vcc is the Vdd shown in FIG. 1), $V_S=0V$, $V_D=0V$, and $V_B=0V$, as shown in FIG. 2. In an exemplary embodiment, the device (NMOS transistor) threshold voltage Vt is the test parameter to be measured. The test time duration is 1000 seconds. In an exemplary embodiment, the tester used for performing the test may have a delay time less than 0.5 ms in relation to the wafer-level reliability (WLR) tester that is performed in parallel. Based on the test results, the changes in Vt (i.e., ΔVt) over time can be obtained, and a graph of the changes in Vt (ΔVt) as a function of time can be plotted.

An SRAM device can be used as a structure for HTOL tests. In an exemplary embodiment, the SRAM device can be a 64 Mb SRAM device. Those of skill in the art will appreciate that other sizes of the SRAM device can also be used. The stress tests are conducted under the following conditions: at a temperature of 125° C., the voltage applied to the gate is $V_G=1.4*Vcc$. As described above, the minimum read operating voltage Vmin of the SRAM bit cell is representative of the HTOL, so that Vmin is chosen as the test parameter to be measured. The test time duration is 1000 hours. In an exemplary embodiment, a burn-in tester and functional tester may be used for performing the tests. Based on the test results, changes in Vmin (i.e., ΔVmin) over time can be obtained, and a graph of the changes in Vmin as a function of time can be plotted.

Step S302: establishing a correlation (relationship) between the device's BTI and the IC's HTOL based on the obtained BTI and HTOL test results.

Figure 4A:
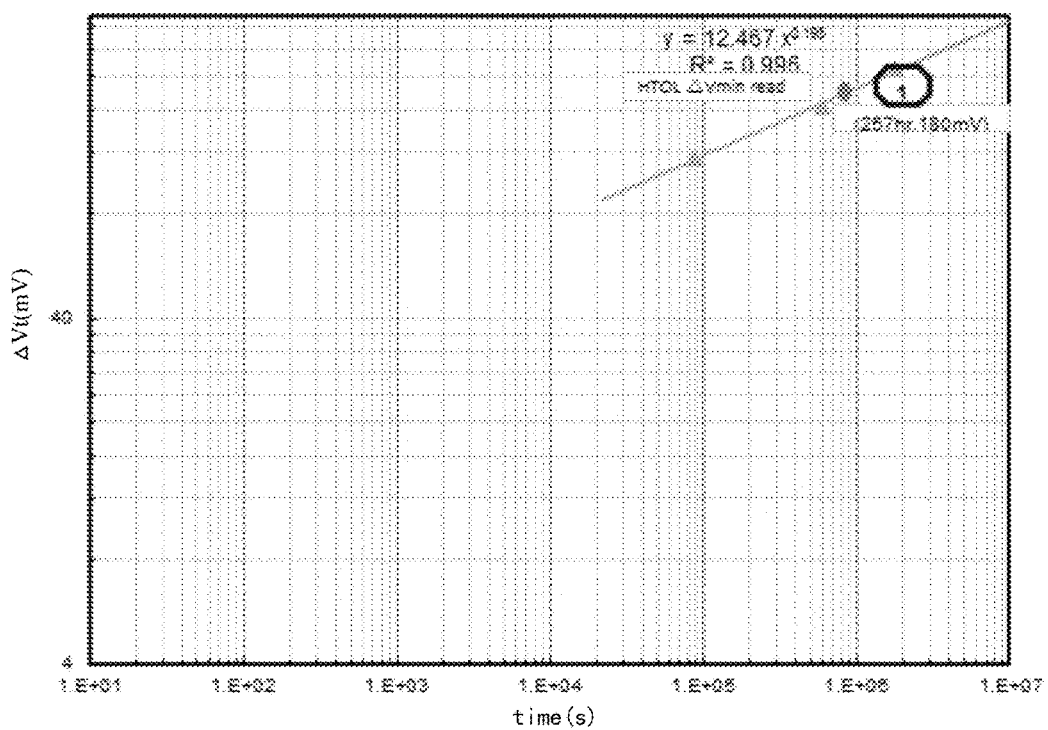
FIGS. 4A-4F are schematic diagrams illustrating specific processes of a step in FIG. 3.
Figure 4B:
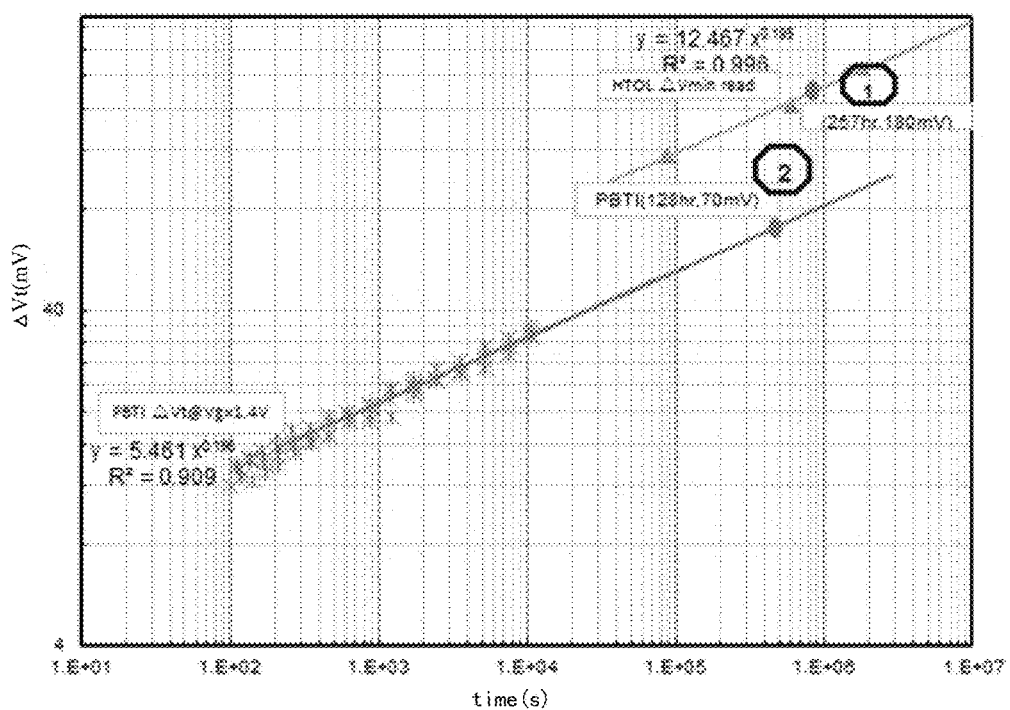
Figure 4C:
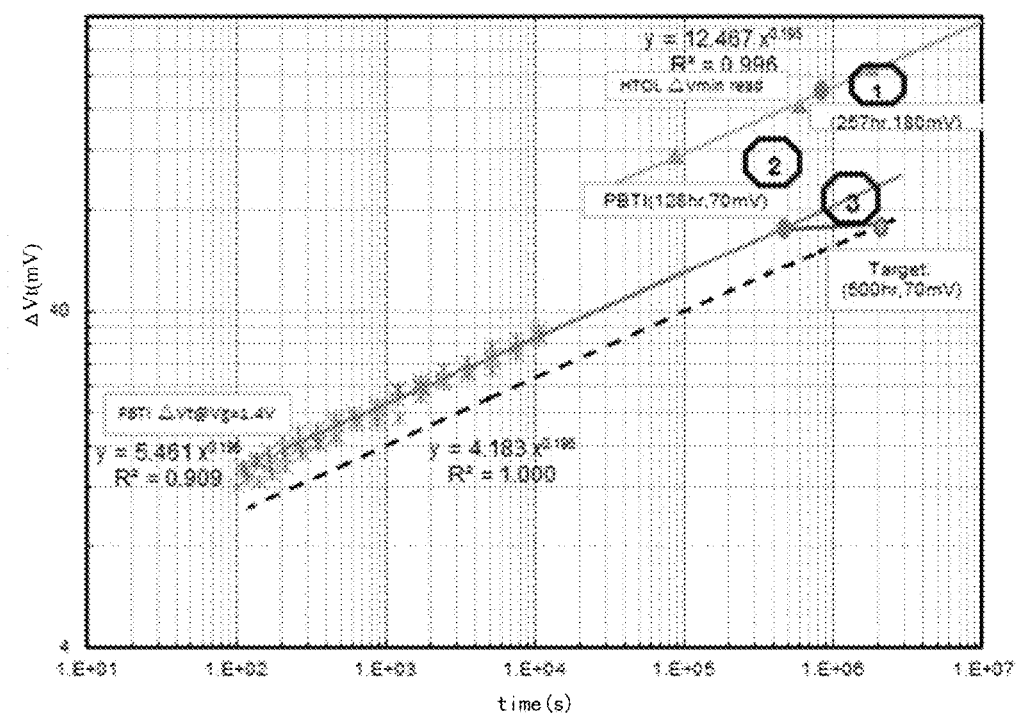
Figure 4D:
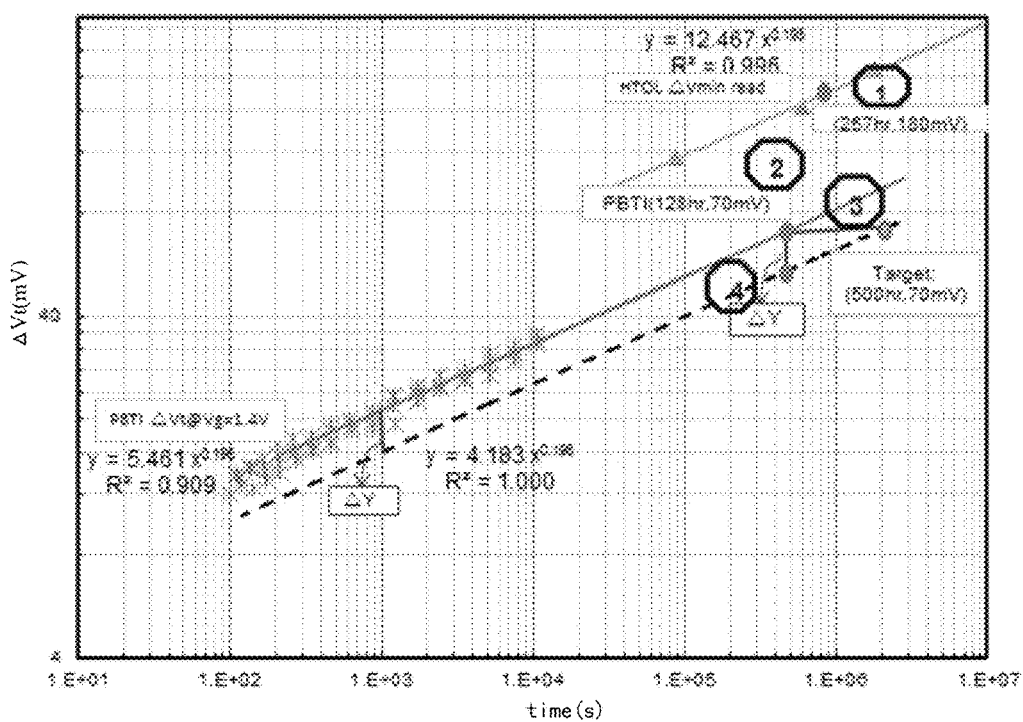
Figure 4E:
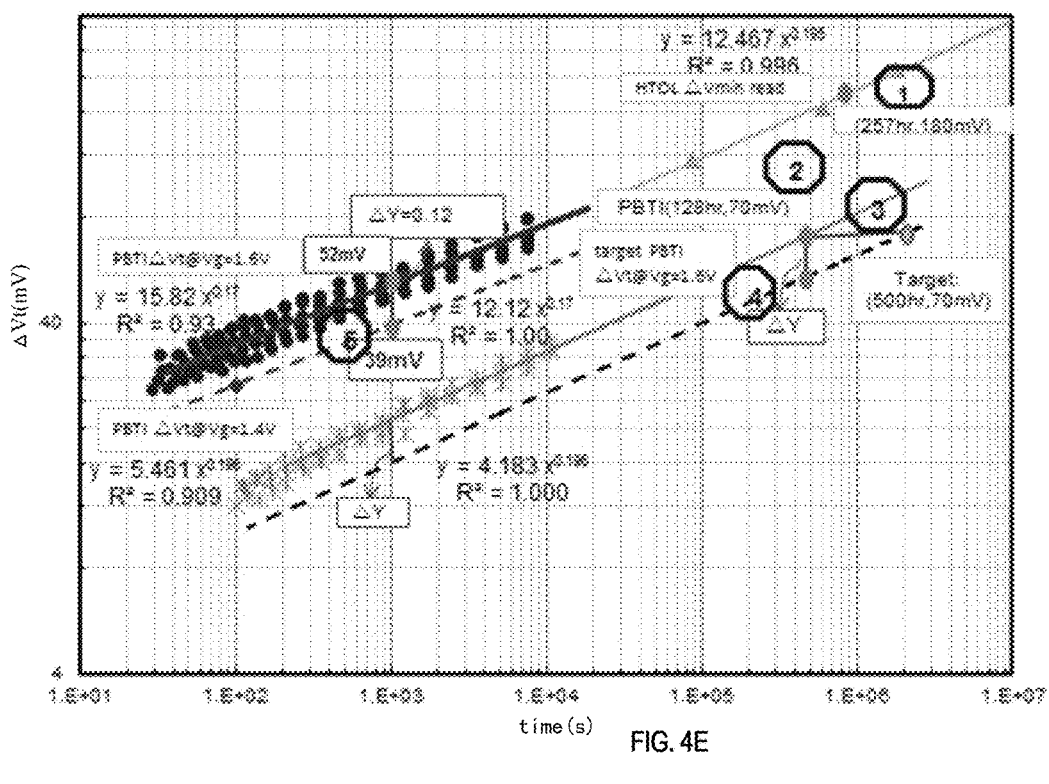

In step S302, the test results obtained in step S301 are analyzed according to following five steps. Step (1): from the HTOL ΔVmin graph as a function of time (in seconds), determine that the current maximum stress time duration is 257 hours (target is 1000 hours) in order to meet the specifications (Vmin=180 mV), denoted by the numeral 1 in FIG. 4A. In the FIGS. 4A-4F and 5A-5B, "y" represents the fitting line (alternatively used as curve, graph) of ΔVtmin at different HTOL read points. $R^2$ or R-square (also known as the coefficient of determination) is a statistical measure. An $R^2$ value of 1.0 indicates a perfect fit, i.e., the predicted values are equal the observed values. The $R^2$ value in FIG. 4A is 0.996 indicating that the ΔVtmin curve (line) fits the target data well. Step (2): from the BTI ΔVt graph as a function of time (in seconds) when 1.4 V is applied to the gate of the NMOS transistor, determine that the current ΔVt=70 mV at the HTOL maximum stress duration in order to meet the specifications (50% duty cycle), as shown in FIG. 4B. As shown in FIG. 4B, HTOL performance (257 hr, 180 mV) (denoted by the numeral 1) is correlated to PBTI performance (128 hr, 70 mV) (denoted by the numeral 2). Step (3): Assuming that the duty cycle is 50%, when the target HTOL is 1000 hours, BTI is 500 hours, thus, the target ΔVt is (500 hours, 70 mV), denoted by the numeral 3 in FIG. 4C. Step (4): from the graph of ΔVmin as a function of time and the point at (500 hours, 70mV), the target BTI ΔVt can be obtained, and from the longitudinal distance ΔY between the target BTI graph and the actual BTI graph, the logarithmic (log) scale of ΔY is 0.12, denoted by the numeral 4 in FIG. 4D. Step (5): Using the same ΔY applying to the BTI ΔVt graph under the stress conditions with the gate voltage of 1.6V and 1000 seconds, the target ΔVt is 39 mV, denoted by the numeral 5 in FIG. 4E. It is noted that the duty cycle is 50% for the exemplary embodiment of 28 nm high-k technology. The above-described processes are also applicable to different duty cycles.

Figure 4F:
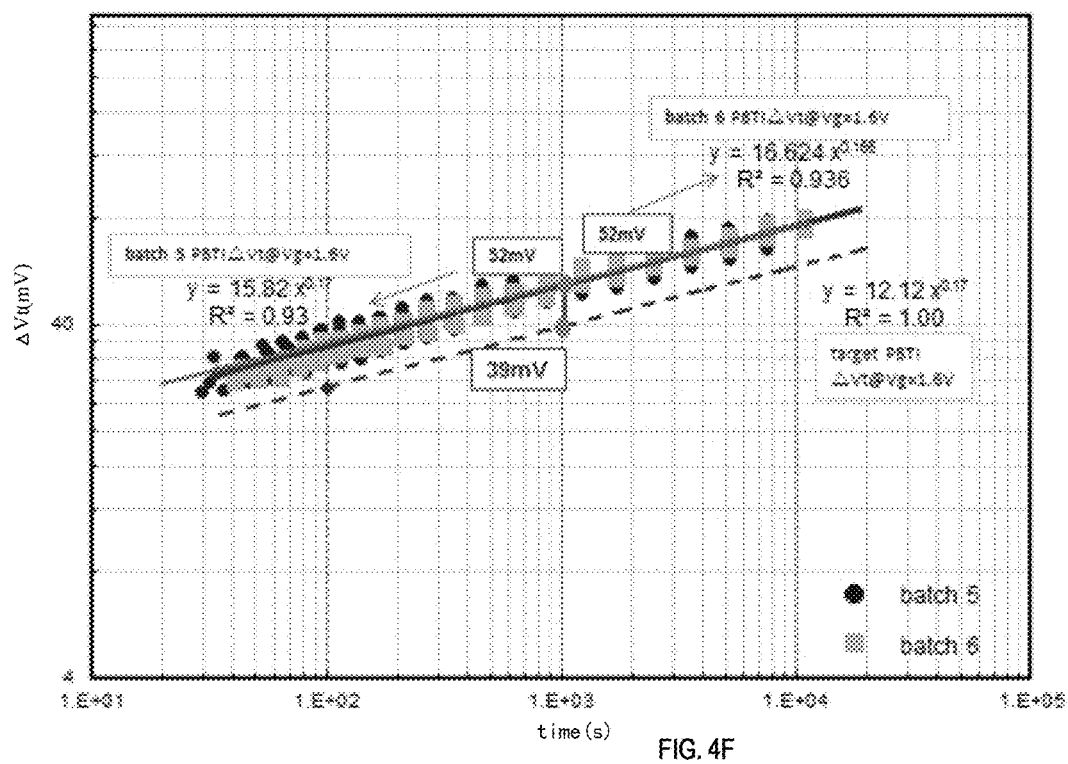
Figure 5A:
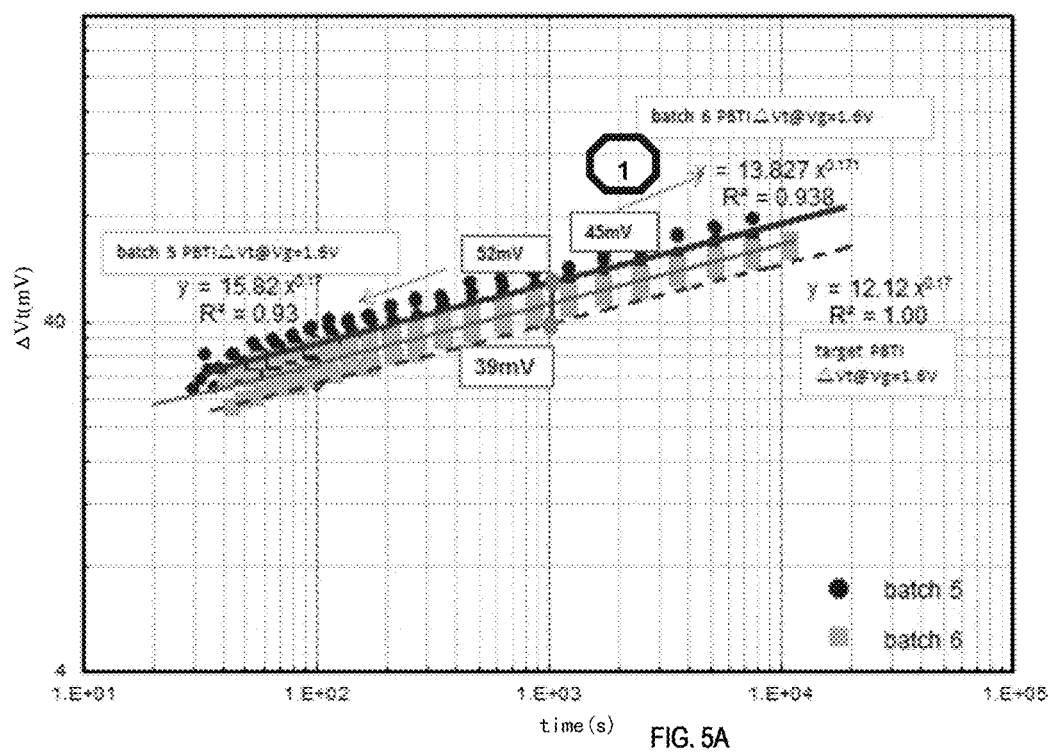
FIGS. 5A-5B are schematic diagrams illustrating specific processes of a step in FIG. 3.
Figure 5B:
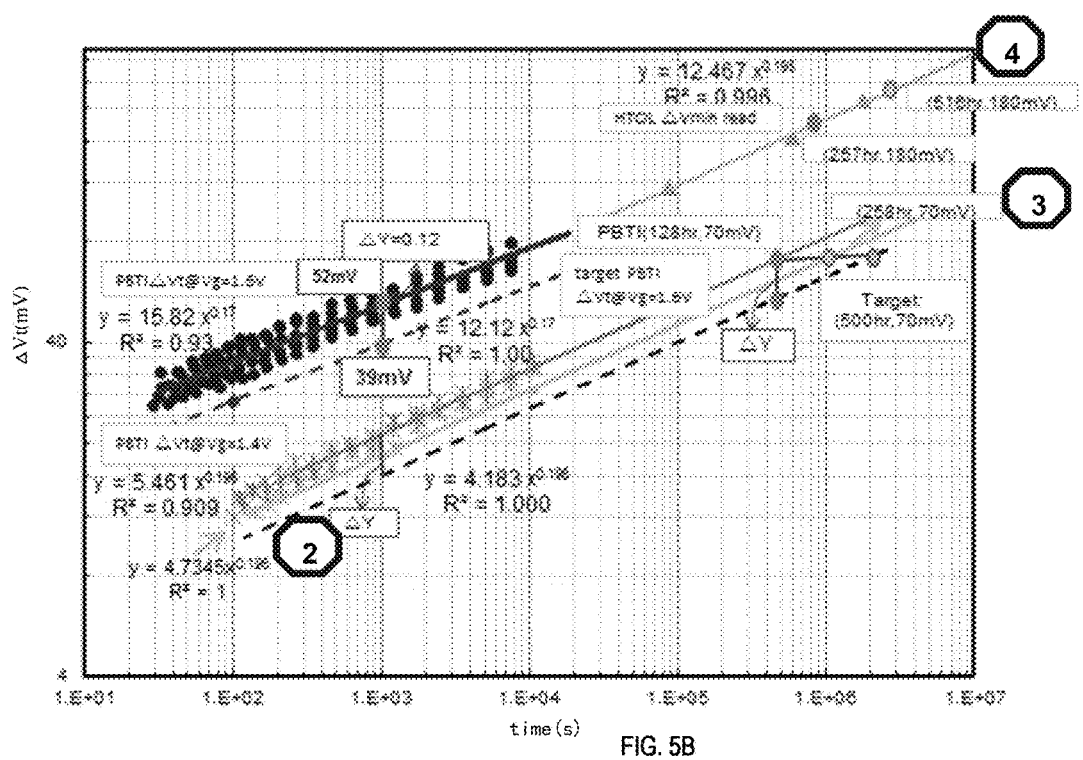

Based on the above analysis, the relationship (correlation) between BTI and HTOL can be established, as shown in FIG. 4F. Two different lots of subsequent integrated circuits (batch 5 of ICs denoted by solid black circles and batch 6 of ICs denoted by grey squares) are shown to have a ΔVt of 52 mV, and the target ΔVt of 39 mV. As used herein, a lot of subsequent integrated circuits refers to a batch of wafers, e.g., 25 wafers. Each wafer includes multiple integrated circuits. Each integrated circuit includes a plurality of devices. In a specific embodiment, the integrated circuits are SRAM devices. The devices in an SRAM device are transistors (e.g., pull-down MOS transistors). Based on this relationship, the PBTI ΔVt specifications can be adjusted to meet the target HTOL.

Step S303: performing wafer-level (WLR) bias temperature instability (BTI) tests on a lot of subsequent integrated circuits (chips).

In step S303, based on the established relationship between the BTI and HTOL in step S302, WLR BTI tests can be performed on a lot of subsequent integrated circuits under the same stress conditions. Based on WLR data and the graphs in step S302, the Vt degradation can be obtained. Then, by comparing the ΔVt specification, the performance of HTOL can be assessed, as will be discussed in step S304 below.

Step S304: predicting HTOL of the lot of subsequent integrated circuits based on test results of wafer-level bias temperature instability and the established relationship between the BTI and HTOL.

Specifically, step 304 may include following four steps: (1) from the graph of BTI ΔVt as a function of time for a new lot (batch) of ICs (chips) under 1.6 V stress conditions, a ΔY is 0.06 (under a logarithmic scale), step (1) is denoted by the numeral 1 in FIG. 5A; (2) apply the ΔY to the BTI ΔVt under 1.4 V stress conditions, a new graph of BTI ΔVt as a function of time can be obtained for the new batch of chips, step (2) is denoted by the numeral 2 in FIG. 5B; (3) from the fitted graph the coordinate point (X, Y)=(258 hours, 70 mV) can be obtained, process (3) is denoted by the numeral 3 in FIG. 5B; (4) from the duty cycle of 50%, when BTI is 258 hours, HTOL is 516 hours, process (4) is denoted by the numeral 4 in FIG. 5B.

A method for predicting high-temperature operating life of an integrated circuit according to specific embodiments of the present invention is thus provided. It is to be understood that specific data in the above described embodiments are exemplary only, and not restrictive. Those of skill in the art will appreciate that other data may also be used, and the present invention is not limited to the above-described data.

According to the present invention, a method for predicting high-temperature operating life of an IC may include establishing a relationship between BTI and HTOL under the same stress conditions, and obtaining an initial assessment of the HTOL performance in an early stage using fast WLR BTI tests together with the established relationship between BTI and HTOL. The method is also applicable to WLR tests under different stress conditions to predict the HTOL performance. Thus, the method can save significant effort and time over conventional approaches.

Figure 6:
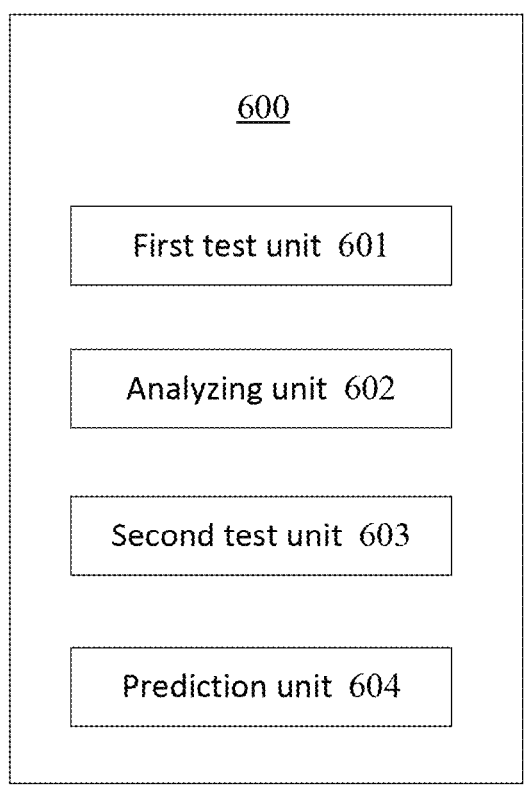
FIG. 6 is a block diagram illustrating an apparatus for predicting high-temperature operating life of an IC according to an embodiment of the present invention.

Embodiments of the present invention also provide an apparatus for predicting high-temperature operating life of an integrated circuit (or chip). FIG. 6 is a block diagram of an apparatus 600 for predicting high-temperature operating life of an integrated circuit according to an embodiment of the present invention. Apparatus 600 includes a first test unit 601 configured to perform bias temperature instability (BTI) tests on a first device in an integrated circuit (IC) including multiple first devices and high-temperature operating life (HTOL) tests on the IC, an analyzing unit 602 configured to establish a relationship between the device's BTI and the IC's HTOL based on a result of the BTI tests and HTOL tests, a second test unit 603 configured to perform wafer-level bias temperature instability tests on a second device of a lot (batch) of subsequent integrated circuits each including multiple second devices, and a prediction unit 604 configured to predict high-temperature operating life of the lot of subsequent integrated circuits based on a result of the wafer-level BTI tests of the second device and the established relationship between BTI and HTOL of the device.

In an embodiment, first test unit 601 performs the first device's BTI tests and the IC's HTOL tests under the same stress conditions.

In an embodiment, the HTOL tests may include measuring changes of the minimum read operating voltage of the IC over time.

In an embodiment, the integrated circuit may be a static random access memory (SRAM) device or a SRAM bit cell. First test unit 601 may include measuring the minimum read operating voltage of the SRAM device or bit cell.

Specifically, the pull-down MOS transistor has an impact on the high-temperature operating life of the SRAM bit cell. In an embodiment, first test unit 601 is configured to perform tests on the positive bias temperature instability of the pull-down MOS transistor. Illustratively, bias temperature instability tests include testing the change of threshold voltages of the pull-down MOS transistor over time.

In an embodiment, analyzing unit 602 is configured to establish a relationship between BTI and HTOL representing a relationship between degradation of threshold voltage of a single device in a memory bit cell and degradation of the minimum read voltage of the memory bit cell.

Those of skill in the art will appreciate that the steps, functions, and units described herein may be implemented in hardware, software, or a combination of hardware and software (firmware). For example, FIG. 3 is a flowchart illustration of a method for predicting the high-temperature operating life of an integrated circuit. The steps of the flowchart may represent modules (or units) that can be implemented in hardware, software, or a combination of hardware and software. In some embodiments, the steps of the flowchart can be implemented by computer program instructions. The program instructions may be executed by a processor to implement the functions specified in the flowchart. It will also be understood that the steps in the flowchart can be implemented by special purpose hard-ware based systems or combinations of special purpose hardware and computer instructions which perform the specified steps.

Those of ordinary skill in the art would readily know that additional embodiments, modifications, and variations may exist by combining the above-described methods and apparatus for predicting the high-temperature operating life of an integrated circuit. The methods and apparatuses of the above-referenced embodiments may also include other additional steps and units.

While the present disclosure is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present disclosure could be used to advantage without the corresponding use of other features. As such, the foregoing description should be considered as merely illustrative of the principles of the invention, and not in limitation thereof.

What is claimed is:

1. A method for predicting a high-temperature operating life, the method comprising:
   providing an integrated circuit (IC) including a plurality of first devices;
   performing bias temperature instability tests on a first device of the plurality of first devices;
   performing high-temperature operating life tests on the IC;
   establishing a relationship between the first device's bias temperature instability and the IC's high-temperature operating life based on a result of the bias temperature instability tests and the high-temperature operating life tests;
   providing a lot of subsequent integrated circuits (ICs) each including a plurality of second devices;
   performing wafer-level bias temperature instability tests on a second device of the plurality of second devices; and
   predicting high-temperature operating life of the lot of subsequent ICs based on a result of the wafer-level bias temperature instability tests and based on the relationship between the first device's bias temperature instability and the IC's high-temperature operating life.

2. The method of claim 1, wherein the high-temperature operating life tests comprise testing a change of a minimum operating voltage of the IC over time.

3. The method of claim 2, wherein the IC is a static random access memory (SRAM) device, and the high-temperature operating life tests comprise testing a minimum read operating voltage of the SRAM device.

4. The method of claim 3, wherein the first device is a pull-down transistor of the SRAM device.

5. The method of claim 4, wherein performing the bias temperature instability tests comprises positive bias temperature instability tests of the pull-down transistor.

6. The method of claim 5, wherein performing the bias temperature instability tests comprises testing a change of a threshold voltage of the pull-down transistor over time.

7. The method of claim 6, wherein the relationship between the first device's bias temperature instability and the IC's high-temperature operating life represents a relationship between a threshold voltage degradation of a single device in a memory device and a minimum read operating voltage degradation of the memory device.

8. The method of claim 1, wherein the bias temperature instability tests and the high-temperature operating life tests are performed under a same stress condition.

9. An apparatus for predicting high-temperature operating life of an integrated circuit (IC) comprising a plurality of first devices, the apparatus comprising:
   a first test unit configured to perform bias temperature instability tests on a first device of the plurality of first devices and high-temperature operating life tests of the IC;
   an analyzing unit configured to establish a relationship between the first device's bias temperature instability and the IC's high-temperature operating life based on a result of the bias temperature instability tests and the high-temperature operating life tests;
   a second test unit configured to perform wafer-level bias temperature instability tests on a second device of a lot of subsequent integrated circuits (ICs) each comprising a plurality of second devices; and
   a prediction unit configured to predict high-temperature operating life of the subsequent ICs based on a result of the wafer-level bias temperature instability tests and the relationship between the first device's bias temperature instability and the IC's high-temperature operating life.

10. The apparatus of claim 9, wherein the high-temperature operating life tests comprise testing a change of a minimum operating voltage of the IC over time.

11. The apparatus of claim 10, wherein the IC is a static random access memory (SRAM) device, and the high-temperature operating life tests comprise testing a minimum read operating voltage of the SRAM device.

12. The apparatus of claim 11, wherein the first device is a pull-down transistor of the SRAM device.

13. The apparatus of claim 12, wherein the first test unit is configured to perform positive bias temperature instability tests of the pull-down transistor.

14. The apparatus of claim 13, wherein the first test unit is configured to test a change of a threshold voltage of the pull-down transistor over time.

15. The apparatus of claim 14, wherein the established relationship between the first device's bias temperature instability and the IC's high-temperature operating life represents a relationship between a threshold voltage degradation of a single device in a memory device and a minimum read operating voltage degradation of the memory device.

16. The apparatus of claim 9, wherein the first test unit performs the bias temperature instability tests and the high-temperature operating life tests under a same stress condition.

* * * * *